United States Patent
Chen et al.

(10) Patent No.: US 6,873,506 B2
(45) Date of Patent: Mar. 29, 2005

(54) SYSTEM AND METHOD FOR ELECTROSTATIC DISCHARGE PROTECTION USING LATERAL PNP OR PMOS OR BOTH FOR SUBSTRATE BIASING

(75) Inventors: Zhiliang Julian Chen, Plano, TX (US); Thomas A. Vrotsos, Richardson, TX (US); Ajith E. Amerasekera, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 7 days.

(21) Appl. No.: 10/655,865

(22) Filed: Sep. 5, 2003

(65) Prior Publication Data

US 2004/0047094 A1 Mar. 11, 2004

Related U.S. Application Data

(63) Continuation of application No. 09/546,988, filed on Apr. 11, 2000, now Pat. No. 6,628,493.
(60) Provisional application No. 60/129,466, filed on Apr. 15, 1999.

(51) Int. Cl.[7] .............................................. H02H 9/00
(52) U.S. Cl. ........................ 361/56; 361/58; 361/111
(58) Field of Search ...................... 361/56, 58, 91.1, 361/111, 118, 119, 127, 100, 115

(56) References Cited

U.S. PATENT DOCUMENTS

| | | | |
|---|---|---|---|
| 4,939,619 A | 7/1990 | Borkowicz et al. | ......... 361/117 |
| 5,012,317 A | 4/1991 | Rountre | ......................... 357/38 |
| 5,465,189 A | 11/1995 | Polgreen et al. | ............... 361/58 |
| 6,327,126 B1 * | 12/2001 | Miller et al. | ................... 361/56 |

* cited by examiner

Primary Examiner—Stephen W. Jackson
(74) Attorney, Agent, or Firm—Yingsheng Tung; Wade James Brady, III; Frederick J. Telecky, Jr.

(57) ABSTRACT

The invention comprises a system and method for providing electrostatic discharge protection. In one embodiment of the invention, an integrated circuit (10) comprising at least one input element (20) is protected by a protective circuit (40). The protective circuit (40) is operable to protect the integrated circuit (10) from damage due to electrostatic discharge and may be coupled to the input element (20). The protective circuit (40) comprises a lateral NPN transistor (T1) coupled to the input element (20) and operable to activate when the input element voltage exceeds threshold, the threshold greater than or equal to the ordinary operating voltage of circuitry coupled to the input element (20). The protective circuit (40) also may comprise a lateral PNP transistor (T2) coupled to the input element (20) and to the lateral NPN transistor (T1). The lateral PNP transistor (T2) is operable to aid in raising a potential of the base of the lateral NPN transistor (T1). Alternatively, the protective circuit (40) also may use a PMOS transistor (P1), or a PMOS transistor (P1) in combination with the lateral NPN transistor (T1), coupled to the input element (20) and to the lateral NPN transistor (T1). The PMOS transistor (P1) is operable to aid in raising the potential of the base of the lateral NPN transistor (T1).

9 Claims, 4 Drawing Sheets

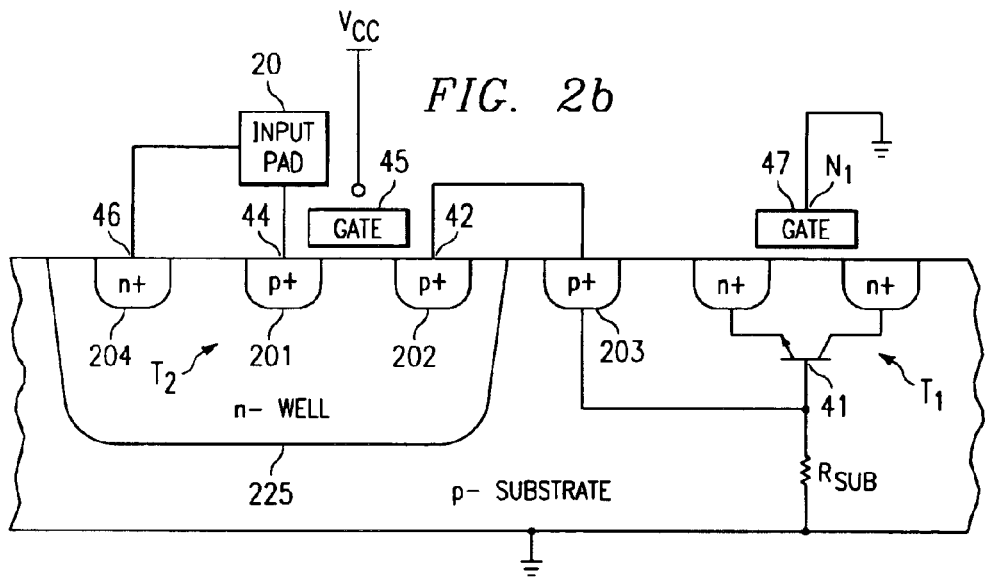
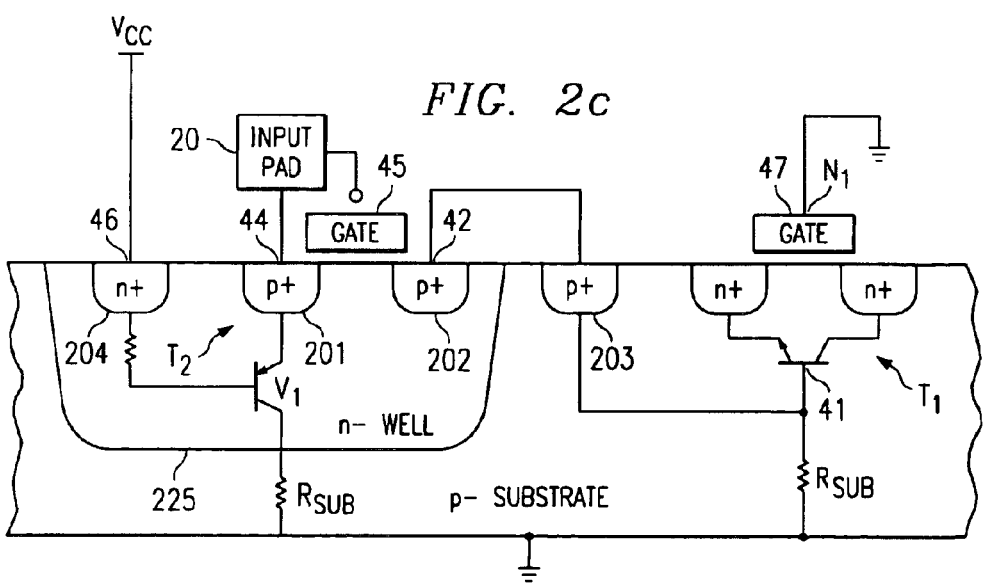

SYSTEM AND METHOD FOR ELECTROSTATIC DISCHARGE PROTECTION USING LATERAL PNP OR PMOS OR BOTH FOR SUBSTRATE BIASING

CROSS REFERENCE TO PRIOR APPLICATIONS

This is a continuation of application Ser. No. 09/546,988 filed Apr. 11, 2000 now U.S. Pat. No. 6,628,493 which claims priority under 35 USC 119(e)(1) of provisional application No. 60/129,466 filed Apr. 15, 1999.

TECHNICAL FIELD OF THE INVENTION

This invention relates generally to the field of integrated circuits and more particularly to a system and method for electrostatic discharge protection.

BACKGROUND OF THE INVENTION

Integrated circuits often employ electrostatic discharge protection to prevent damage to electronic devices during an electrostatic discharge event. Such protection may prevent damage from high voltage or current transients, including those that may occur during installation. Metal oxide semiconductor (MOS) integrated circuits are particularly vulnerable to electrostatic discharge because an electrostatic discharge event may melt the silicon or damage gate oxides and/or the short channel devices used in their design. Designing integrated circuits into deep sub-micron scale presents challenges to traditional forms of electrostatic discharge protection.

One prior approach used for electrostatic discharge protection employs a lateral NPN transistor formed by an n-channel MOSFET (NMOS) or field oxide device between the input pad and a substrate closely coupled to ground. The device is used to shunt to ground the large transient current caused by an electrostatic discharge event by turning on the lateral NPN when an event occurs. This approach may also utilize a vertical PNP transistor with a collector common to the substrate to trigger forward biasing of the lateral NPN transistor. When placed near the lateral NPN transistor, the vertical PNP transistor may lower the trigger voltage of the lateral NPN by raising the local substrate potential near the base of the lateral NPN transistor.

This prior approach may not be particularly effective in deep sub-micron products, such as those utilizing silicided CMOS technology. Silicided CMOS products generally have low substrate resistance and often encounter problems with uniform turn-on, and even failure, of the lateral NPN transistor. This approach may also not be particularly advantageous for mixed signal products, where chip capacitance is normally substantially smaller. In such products, large substrate current injection may be desirable to bias the substrate near the lateral NPN transistor. Larger circuit area, not usually available in modern sub-micron designs, may be used to achieve such current injection. Furthermore, the vertical PNP trigger may become de-biased at these chip capacitances. Therefore, a suitably-sized device resistant to de-biasing is needed to provide relatively uniform current injection into the substrate, to activate the lateral NPN transistor.

SUMMARY OF THE INVENTION

The invention comprises a system and method for providing electrostatic discharge protection. In one embodiment of the invention, an integrated circuit comprising at least one input element is protected by a protective circuit. The protective circuit is operable to protect the integrated circuit from damage due to electrostatic discharge and may be coupled to the input element. The protective circuit comprises a lateral NPN transistor coupled to the input element and operable to activate when the input element voltage exceeds threshold, the threshold greater than or equal to the ordinary operating voltage of circuitry coupled to the input element. The protective circuit also comprises a lateral PNP transistor coupled to the input element and to the lateral NPN transistor. The lateral PNP transistor is operable to aid in raising a potential of the base of the lateral NPN transistor. Alternatively, the protective circuit also may use a PMOS transistor, or a PMOS transistor in combination with the lateral NPN transistor, coupled to the input element and to the lateral NPN transistor. The PMOS transistor is operable to aid in raising the potential of the base of the lateral NPN transistor.

The invention provides several important technical advantages. The invention is particularly advantageous in providing uniform turn on of the lateral NPN transistor. The protection circuit is not subject to de-biasing at smaller chip capacitances. Thus, the invention may be used for integrated circuits utilizing silicided CMOS, mixed signal products, or other deep sub-micron or smaller technologies. The invention may also be used with larger technologies. The disclosed protection circuit does not require a large design area in order to provide electrostatic discharge protection, thus potentially conserving valuable circuit space.

BRIEF DESCRIPTION OF THE DRAWINGS

For a more complete understanding of the present invention and the advantages thereof, reference is now made to the following descriptions taken in connection with the accompanying drawings in which:

FIG. 2b illustrates a circuit cross-section of a second embodiment of an electrostatic discharge protection circuit utilizing the teachings of the present invention.

FIG. 2c illustrates a circuit cross-section of a third embodiment of an electrostatic discharge protection circuit utilizing the teachings of the present invention.

DETAILED DESCRIPTION OF THE INVENTION

The present invention and its advantages are best understood by referring to FIGS. 1 through 5 of the drawings, like numerals being used for like and corresponding parts of the various drawings.

Figure 1:
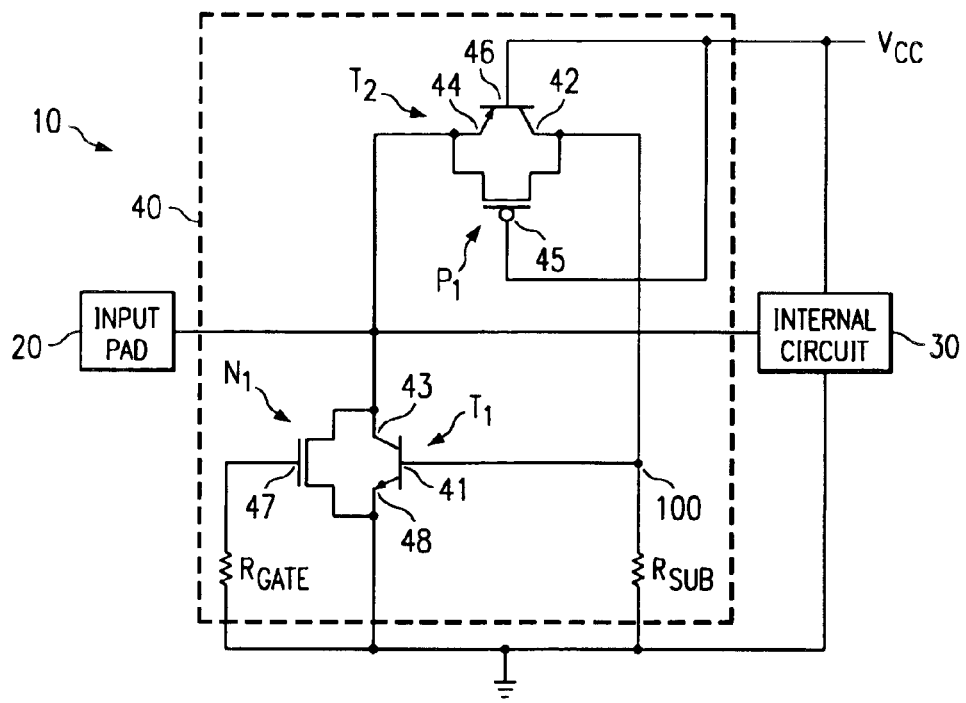
FIG. 1 illustrates a schematic diagram of one embodiment of an electrostatic discharge protection circuit utilizing the teachings of the present invention.

FIG. 1 illustrates a schematic diagram of one embodiment of an electrostatic discharge protection circuit. Integrated circuit 10 comprises an input pad 20, a protective circuit 40, and an internal circuit 30. Protective circuit 40 electrically couples input pad 20 to internal circuit 30 and provides protection to internal circuit 30 from damage that may be caused by transient signals resulting from an electrostatic discharge event. Although input pad 20 serves as an input element in this embodiment, any input element could be used without departing from the invention. Although direct connections are illustrated for various elements, many elements may be coupled through other elements without departing from the scope of the invention.

Protective circuit 40 comprises a lateral NPN transistor T1 and a lateral PNP transistor T2, common to a p-type substrate closely coupled to ground. Lateral PNP transistor T2 serves as a trigger. In this embodiment, lateral NPN transistor T1 comprises the drain, source and channel region of an NMOS device N1, while lateral PNP transistor T2 comprises the drain, source and channel region of a PMOS device P1. Lateral NPN transistor T1 and lateral PNP transistor T2 may also be formed using field oxide devices without departing from the scope of the invention.

Input pad 20 is coupled to internal circuit 30, in this case by a direct connection. Input pad 20 may also be coupled to collector 43 of lateral NPN transistor T1, and to emitter 44 of lateral PNP transistor T2. Emitter 48 of lateral NPN transistor T1 is coupled to ground. Collector 42 of lateral PNP transistor T2 couples to base 41 of lateral NPN transistor T1 at node 100. Node 100 may be coupled to ground through resistance of the substrate, denoted $R_{sub}$. Gate 47 of NMOS N1 couples to ground through gate resistance $R_{gate}$. This embodiment employs lateral PNP transistor T2 with both gate 45 of PMOS P1 and base 46 coupled to a reference voltage, denoted $V_{cc}$. $V_{cc}$ may be any reference voltage, such as one power supply voltage used in integrated circuit 10. The same is true for other references to $V_{cc}$ herein. Other embodiments for lateral PNP transistor T2 may be used without departing from the scope of the invention. Lateral PNP transistor T2 is discussed in further detail in conjunction with FIG. 2a.

In operation, protective circuit 40 protects internal circuit 30 by shunting from input pad 20 to ground excess current caused by electrostatic discharge events. Protective circuit 40 operates to limit the current provided to and voltages within internal circuit 30 to operable ranges for devices therein, such as MOSFETS.

Lateral NPN transistor T1 operates as a high impedance device until an electrostatic discharge event causes a large current or voltage transient at input pad 20. A voltage applied to input pad 20 that causes the voltage between drain 43 and the substrate to reach the junction breakdown voltage, $V_{av}$, activates lateral NPN transistor T1. When lateral NPN transistor T1 is activated, or turned on, by sufficient forward voltage bias $V_{av}$, current flows through the substrate to ground from collector 43 to emitter 48, creating a low impedance device. It is desirable to reduce $V_{av}$, because lateral NPN transistor T1 operates more efficiently at voltages lower than $V_{av}$.

In this embodiment, NMOS N1 operates to reduce the avalanche voltage, $V_{av}$, required to turn on lateral NPN transistor T1. Capacitive coupling between input pad 20 and gate 47 of NMOS N1 also operates to reduce the voltage required, $V_{av}$, to turn on lateral NPN transistor T1. $R_{gate}$ similarly raises the voltage of gate 47 of NMOS N1, thus reducing $V_{av}$, and providing additional shunt current through NMOS N1 to ground through source 48 of NMOS N1. Reducing avalanche voltage $V_{av}$ reduces the likelihood that lateral NPN transistor T1 will fail. Such failure in protective circuit 40 during an electrostatic discharge event could subject internal circuit 30 to potential damage.

Lateral PNP transistor T2 may be used to raise the local potential of the substrate near lateral NPN transistor T1, in order to help activate transistor T1. In this embodiment, lateral PNP transistor T2 is used to trigger current injection into the substrate. Lateral PNP transistor T2 injects current from collector 42 to base 41 of lateral NPN transistor T1. This current injection increases the local substrate potential, and thus the voltage of base 41 of lateral NPN transistor T1. This current injection thus triggers the activation of transistor T1 by reducing $V_{av}$.

Figure 2A:
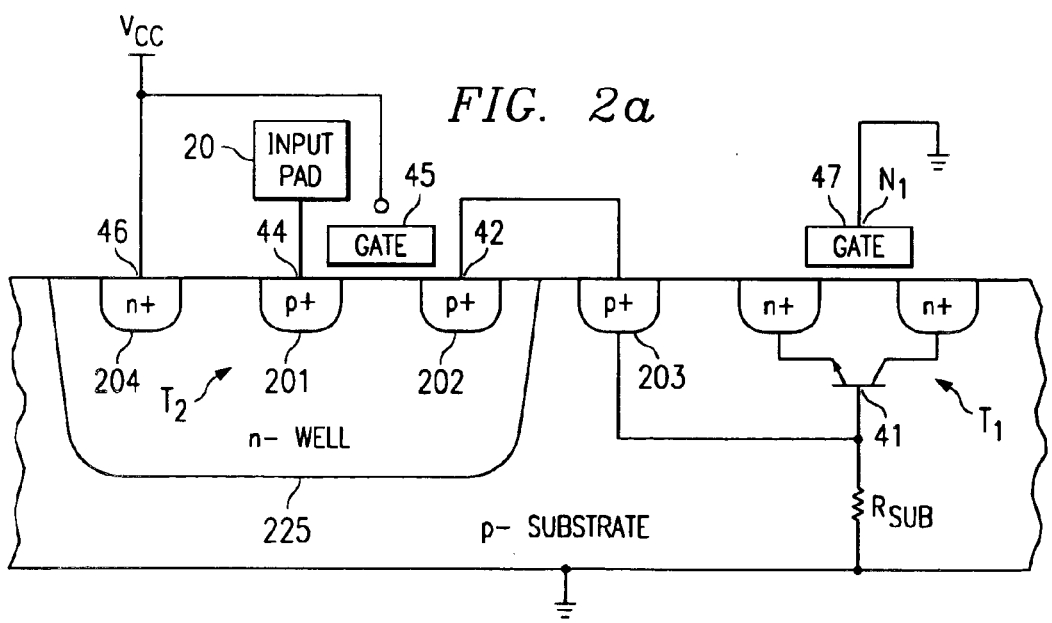
FIG. 2a illustrates an equivalent circuit cross-section of the embodiment of FIG. 1.

FIG. 2a illustrates an equivalent circuit cross-section of protective circuit 40 of FIG. 1. Lateral PNP transistor T2 may be formed by two surface, heavily positively doped (p+) diffusions 201, 202 in an n-well 225 which form emitter 44 and collector 42. The base of lateral PNP transistor T2 is connected to $V_{cc}$ using n+ diffusion 204. In this embodiment, lateral PNP transistor T2 comprises the drain, source and channel regions of PMOS transistor P1, with source 44 at p+ diffusion 201 and drain 42 at p+ diffusion 202. Lateral PNP transistor T2 may also be formed by using a field oxide device, rather than PMOS device P1, without departing from the scope of the invention. Thus, gate 45 of PMOS P1 would be replaced by an isolating oxide that would completely separate the two p+ diffusions 201, 202.

In this embodiment, emitter 44 couples to input pad 20. Collector 42 couples to base 41 of lateral NPN transistor T1 at p+ diffusion 203. Base 46 of lateral PNP transistor T2 and gate 45 of PMOS P1 are coupled to a power supply voltage $V_{cc}$. A voltage applied across the base—emitter junction exceeding a threshold voltage of transistor T2 will activate lateral PNP transistor T2, and initiate current flow to collector 42. An embodiment using a PMOS transistor P1 to form lateral PNP transistor T2 will also generate PMOS current from source 44 to drain 42, and may enhance current through collector 42, and thus to base 41 of lateral NPN transistor T1.

Lateral PNP transistor T2 may also be used in other embodiments without departing from the scope of the invention. For example, in another embodiment illustrated in FIG. 2b, the source 44 and n-well (also labeled as base 46) of PMOS transistor P1 may be coupled to input pad 20. The drain 42 may be coupled to the base 41 of lateral NPN transistor T1, while the Gate 45 is connected to a reference voltage such as $V_{cc}$. In such an embodiment, PMOS transistor P1 injects current into base 41 of lateral NPN transistor T1. Here, PMOS transistor P1, may trigger activation of lateral NPN transistor T1 by supplying current to its base region. This embodiment may or may not also employ lateral PNP transistor T2 to aid in the activation of lateral NPN transistor T1.

Another embodiment may utilize a plurality of lateral NPN transistor T2 or PMOS transistors P1. In yet another embodiment, as illustrated in FIG. 2c, both source 44 and gate 45 of PMOS P1 may be coupled to input pad 20. Additional current may also be injected into the substrate by forming a vertical PNP transistor V1 near lateral NPN transistor T1. A vertical PNP transistor may be formed by a lateral p-n diode using the substrate as its collector. The lateral p-n diode is coupled to input pad 20 at a p+ diffusion and to supply voltage $V_{cc}$ at an n+ diffusion. Other embodiments of vertical PNP transistors may be used without departing from the scope of the invention.

Figure 3:
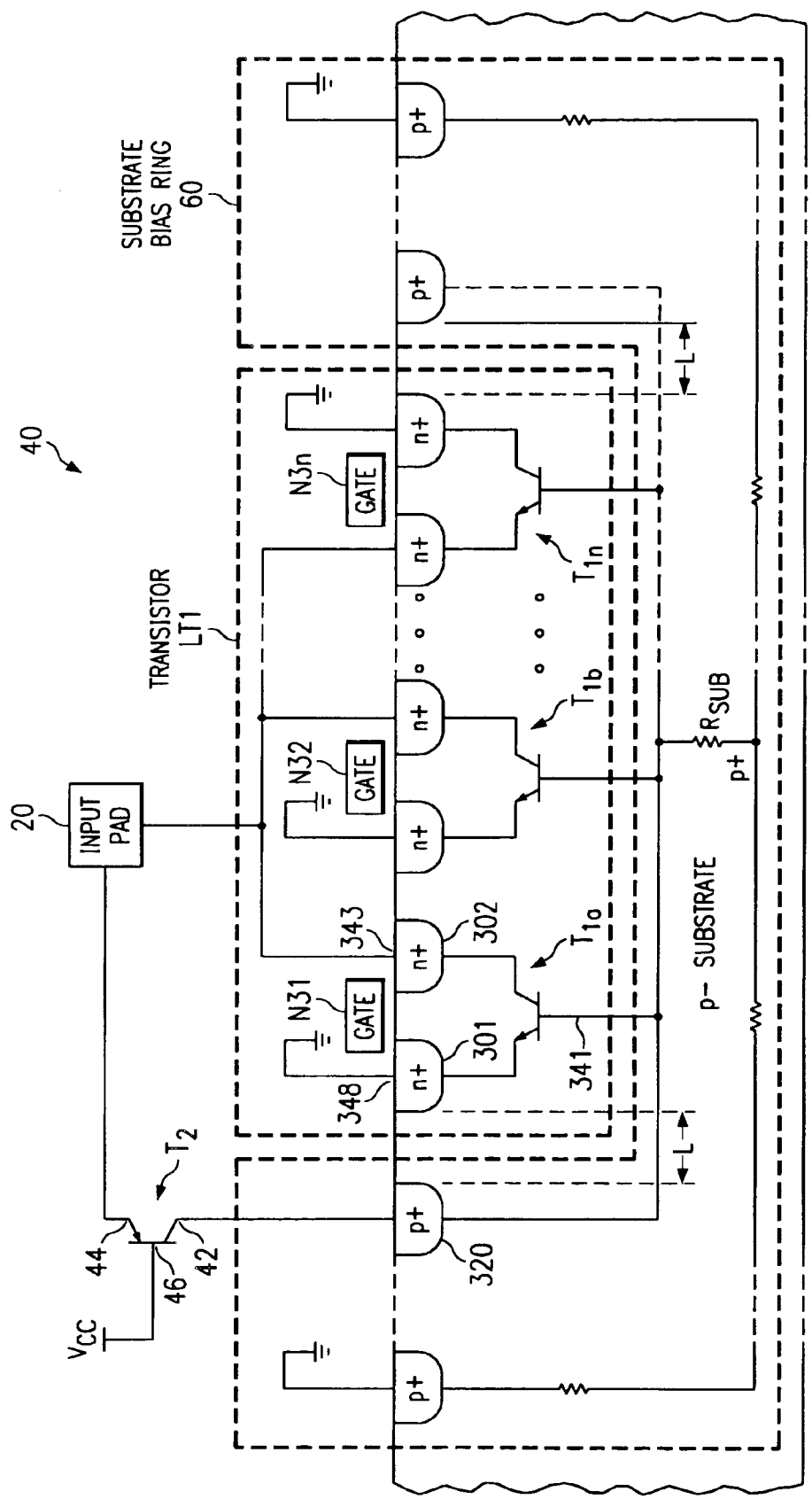
FIG. 3 illustrates a cross-section of a fourth embodiment of an electrostatic discharge protection circuit utilizing the teachings of the present invention.

FIG. 3 illustrates a cross-section of a fourth embodiment of an electrostatic discharge protection circuit utilizing the teachings of the present invention. Protective circuit 40 comprises lateral PNP transistor T2, lateral NPN transistor LT1, and substrate bias ring 60. Substrate bias ring 60 is illustrated and discussed in further detail in conjunction with FIG. 4. Lateral NPN transistor LT1 comprises a plurality of lateral NPN transistors T1a, T1b, ..., T1n in parallel.

Substrate bias ring 60 is coupled to both lateral PNP transistor T2 and lateral NPN transistor LT1. As described in conjunction with FIGS. 1 and 2, emitter 44 of lateral PNP transistor T2 couples to input pad 20, and base 46 couples to power supply voltage $V_{cc}$. Collector 42 of lateral PNP transistor T2 couples to substrate bias ring 60, at p+ diffusion 320.

Each lateral NPN transistor T1a, ..., T1n may be formed by two surface, heavily negatively doped (n+) diffusions. For example, lateral NPN transistor T1a is formed between n+ diffusions 301, 302. In this embodiment, lateral NPN transistor T1a comprises the drain, source and channel regions of NMOS N31, with source 348 at n+ diffusion 301, and drain 343 at n+ diffusion 302. Collector 343 of lateral NPN transistor T1a couples to input pad 20. Emitter 348 couples to ground. Base 341 couples to ground through resistance of the p-type substrate, designated $R_{sub}$. Collector 42 of lateral PNP transistor T2 and base 341 of lateral NPN transistor T1 are coupled to substrate bias ring 60. Thus, collector 42 of lateral PNP transistor T2 is coupled to each base of transistors T1a, ..., T1n of lateral NPN transistor LT1. Similarly, input pad 20 couples to each collector of transistors T1a, ..., T1n of lateral NPN transistor LT1.

In operation, lateral PNP transistor T2 is used, as discussed in conjunction with FIG. 1, to raise the local potential of the substrate near lateral NPN transistor LT1, in order to activate each transistor of lateral NPN transistor LT1. Lateral PNP transistor T2 is used in this embodiment to trigger current injection into the substrate.

Lateral NPN transistor LT1 allows large sizes for lateral NPN transistor T1 without constraining area or distance from input pad 20. Because the plurality of transistors T1a, ..., T1n are connected in parallel, proper operation requires turn-on of all transistors T1a, ..., T1n before excess current causes failure of one transistor, such as T1a. Because deep sub-micron technologies are subject to low substrate resistance, it is desirable to ensure a relatively uniform distribution of the voltage around each transistor T1a, ..., T1n. Relatively uniform injection can thus be applied through all lateral NPN transistors T1a, ..., T1n, by raising the substrate potential locally near lateral NPN transistor LT1. Injecting hole current to raise the base voltage of lateral NPN transistor LT1 turns on each transistor T1a, ..., T1n without reaching hard avalanche action in the base-collector junction (or drain-substrate junction of each NMOS). Substrate bias ring 60 provides this advantage in this embodiment.

Lateral PNP transistor T2 injects current from collector 42 to substrate bias ring 60, which is coupled to each base of lateral NPN transistor LT1. Such current injection locally increases the substrate potential near each base of lateral NPN transistor LT1. This current injection into substrate bias ring 60 thus triggers the activation of each lateral NPN transistor T1a, ..., T1n by reducing $V_{av}$. This method avoids a reliance on avalanche breakdown between each NMOS drain and substrate, which may lead one transistor such as T1a to fail. It thus provides more reliable protection from electrostatic discharge events.

Figure 4:
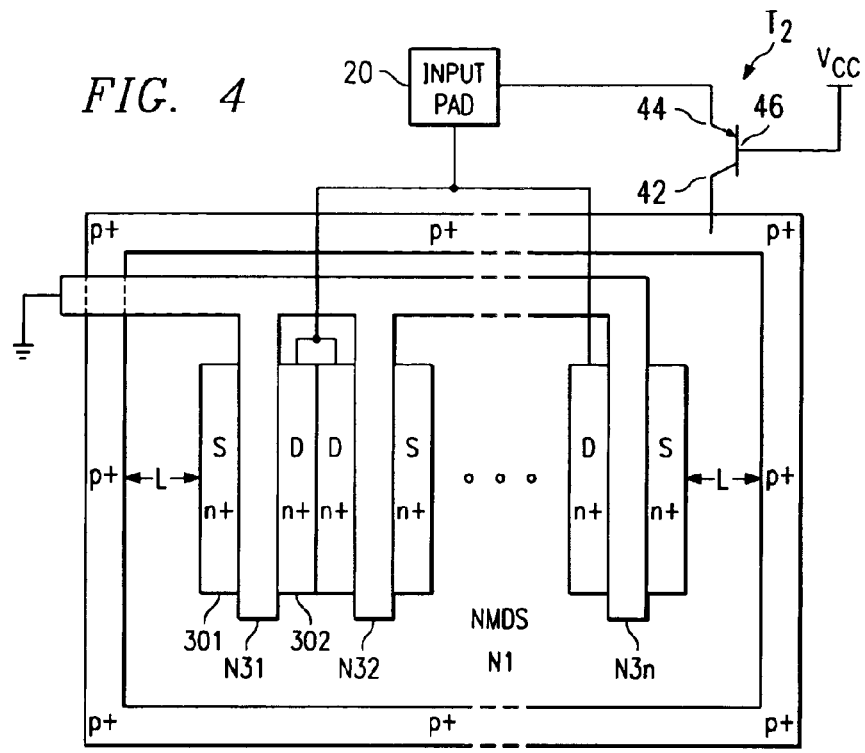
FIG. 4 illustrates a top view of the electrostatic discharge protection circuit of FIG. 3.

FIG. 4 illustrates a top view of the fourth embodiment of an electrostatic discharge protection circuit as illustrated in FIG. 3. FIG. 4 clarifies one possible placement of substrate bias ring 60 in protective circuit 40. Protective circuit 40 comprises lateral PNP transistor T2, lateral NPN transistor LT1, and substrate bias ring 60, as shown in FIG. 3. In this embodiment, lateral NPN transistors T1a, ..., T1n comprise the drain, source and channel regions of NMOS N31, ..., N3n.

Substrate bias ring 60 comprises a p+ diffusion area that surrounds lateral NPN transistor LT1. Substrate bias ring 60 may be placed at a distance L from both lateral NPN transistor T1a, and from lateral NPN transistor T1n. Distance L may be small to enhance the substrate bias effect, because there is no SCR structure formed in this protection scheme. Because it may be advantageous to minimize distance L, protective circuit 40 may be designed compactly. For example, one could place substrate bias ring 60 within five microns of lateral NPN transistor LT1.

Figure 5:
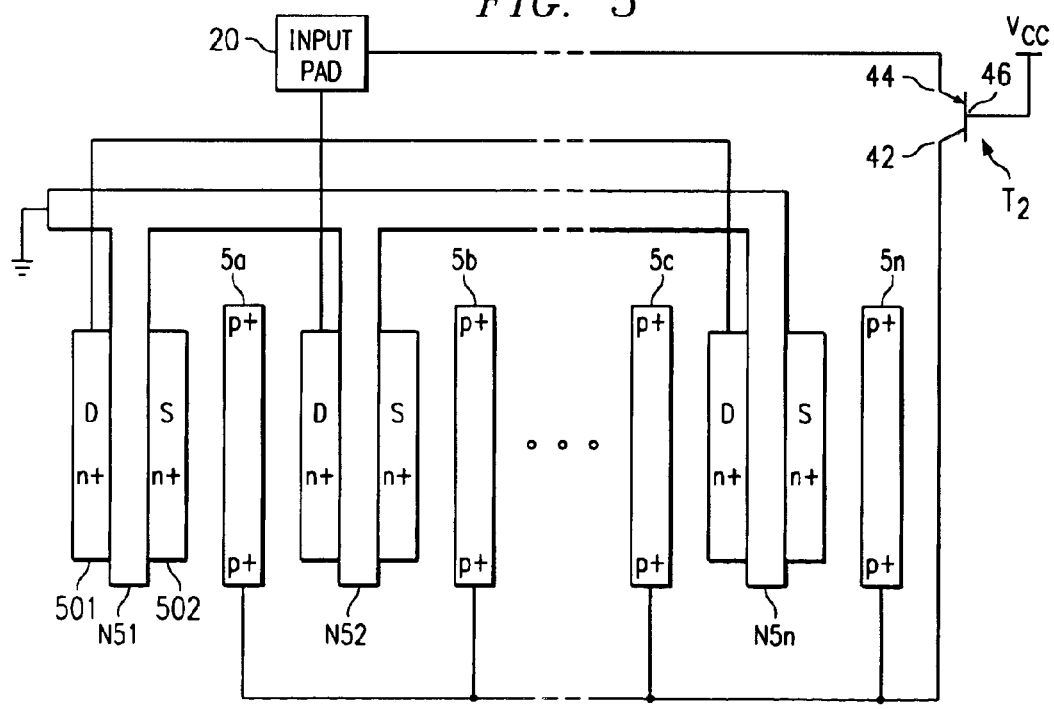
FIG. 5 illustrates a top view of a fifth embodiment of an electrostatic discharge protection circuit utilizing the teachings of the present invention.

FIG. 5 illustrates a top view of a fifth embodiment of an electrostatic discharge protection circuit utilizing the teachings of the present invention. Protective circuit 500 comprises lateral PNP transistor T2, and a plurality of lateral NPN transistors T5a, ..., T5n comprising the source, drain and channel regions of a plurality of NMOS transistors N51, ..., N5n. The plurality of lateral NPN transistors T5a, ..., T5n are connected in parallel. Protective circuit 500 also comprises p+ diffusions 5a, ..., 5n.

Each of the p+ diffusions 5a, ..., 5n may be coupled to both lateral PNP transistor T2 and the plurality of NPN transistors T2a, ..., T2n. As described in conjunction with FIGS. 3 and 4, emitter 44 of lateral PNP transistor T2 couples to input pad 20, and base 46 couples to power supply voltage $V_{cc}$. Collector 42 of lateral PNP transistor T2 also coupled to each of the p+ diffusions 5a, ..., 5n.

P+ diffusions 5a, ..., 5n may be interspersed between each of the plurality of NPN transistors T2a, ..., T2n to raise the local substrate potential near each of the plurality of transistors.

As described in conjunction with FIG. 3, the source, drain and channel regions of NMOS transistors N51, ..., N5n forms a lateral NPN transistor. For example, a lateral NPN transistor is formed between n+ diffusions 501, 502, with a source at n+ diffusion 301, and drain at n+ diffusion 302. A collector for each lateral NPN transistor couples to input pad 20. An emitter couples to ground. A base couples to ground through resistance of the substrate. Collector 42 of lateral PNP transistor T2 and the base of each lateral NPN transistor are coupled to each of the p+ diffusions 5a, ..., 5n. Similarly, input pad 20 couples to the collector of each lateral NPN transistor.

In operation, lateral PNP transistor T2 is used, as discussed in conjunction with FIG. 3, to raise the local potential of the substrate near each of the plurality of NMOS transistors N51, ..., N5n, in order to activate each lateral NPN transistor. Lateral NPN transistor T2 is used in this embodiment to trigger current injection into the substrate. In this embodiment, current is injected into each of the p+ diffusions 5a, ..., 5n between each NMOS transistors N51, ..., N5n, rather than into substrate bias ring 60 as shown in FIGS. 3 and 4.

Although the present invention has been described in detail, it should be understood that various changes, substitutions, and alterations can be made hereto without departing from the spirit and scope of the invention as defined by the appended claims.

What is claimed is:

1. An integrated circuit comprising:
   a. a lateral NPN transistor having an emitter, a base, and a collector, the NPN transistor operable to conduct current between the emitter and the collector upon a positive first avalanche voltage applied between the emitter and collector;
   b. an input element operable to receive a input voltage;
   c. a circuitry connected to the input element and to the NPN transistor;

d. an NMOS transistor, having a source, a drain, and a gate, coupled to the lateral NPN transistor;

e. the gate capacitively coupled to input element and resistively coupled to a ground to maintain a voltage corresponding to the input voltage;

f. the NMOS operable to conduct a drain current upon an electrostatic-discharge voltage less positive than the first avalanche voltage applied to the input element, the electrostatic-discharge voltage being more positive than the ordinary operating voltage of the circuitry coupled to the input element;

g. a lateral PNP transistor, having an emitter, a base, and a collector, connected to the input element and resistively coupled to the ground; and h. the lateral PNP transistor operable to conduct a collector current upon an electrostatic-discharge voltage less positive than the first avalanche voltage applied to the input element, the electrostatic-discharge voltage being more positive than the ordinary operating voltage of the circuitry coupled to the input element, the collector current setting a base voltage at the base of the lateral NPN transistor.

2. The integrated circuit in claim 1, further comprising a p-doped element disposed near the base of the lateral NPN transistor, the p-doped element connecting the collector of the lateral PNP transistor and distancing the lateral NPN transistor from the lateral PNP transistor to maintain a SCR-free operation.

3. The integrated circuit in claim 2, in which the NPN transistor includes a plurality emitter elements coupled in parallel, a plurality of base elements coupled in parallel, a plurality of collector elements coupled in parallel, and the p-doped element includes a plurality of p-doped sub-elements coupled in parallel.

4. An integrated circuit comprising:

a. a lateral NPN transistor having an emitter, a base, and a collector, the NPN transistor operable to conduct current between the emitter electrode and the collector electrode upon a positive first avalanche voltage applied between the emitter and collector;

b. an input element operable to receive a input voltage;

c. a circuitry connected to the input element and to the NPN transistor;

d. an NMOS transistor, having a source, a drain, and a gate, coupled to the lateral NPN transistor;

e. the gate capacitively coupled to input element and resistively coupled to a ground to maintain a voltage corresponding to the input voltage;

f. the NMOS operable to conduct a drain current upon an electrostatic-discharge voltage less positive than the first avalanche voltage applied to the input element, the electrostatic-discharge voltage being more positive than the ordinary operating voltage of the circuitry coupled to the input element;

g. a PMOS transistor, having an source, a gate, and a drain, connected to the input element and resistively coupled to the ground; and h. the PMOS transistor operable to conduct a drain current upon an electrostatic-discharge voltage less positive than the first avalanche voltage applied to the input element, the electrostatic-discharge voltage being more positive than the ordinary operating voltage of the circuitry coupled to the input element, the drain current setting a base voltage at the base of the lateral NPN transistor.

5. The integrated circuit in claim 4, further comprising a p-doped element disposed near the base of the lateral NPN transistor, the p-doped element connecting the collector of the lateral PNP transistor and distancing the lateral NPN transistor from the PMOS transistor to maintain a SCR-free operation.

6. The integrated circuit in claim 5, in which the NPN transistor includes a plurality emitter elements coupled in parallel, a plurality of base elements coupled in parallel, a plurality of collector elements coupled in parallel, and the p-doped element includes a plurality of p-doped sub-elements coupled in parallel.

7. An integrated circuit comprising:

a. a lateral NPN transistor having an emitter, a base, and a collector, the NPN transistor operable to conduct current between the emitter and the collector upon a positive first avalanche voltage applied between the emitter and collector;

b. an input element operable to receive a input voltage;

c. a circuitry connected to the input element and to the NPN transistor;

d. an NMOS transistor, having a source, a drain, and a gate, coupled to the lateral NPN transistor;

e. the gate capacitively coupled to input element and resistively coupled to a ground to maintain a voltage corresponding to the input voltage;

f. the NMOS operable to conduct a drain current upon an electrostatic-discharge voltage less positive than the first avalanche voltage applied to the input element, the electrostatic-discharge voltage being more positive than the ordinary operating voltage of the circuitry coupled to the input element;

g. a vertical PNP transistor, having an emitter, a base, and a collector, connected to the input element and resistively coupled to the ground; and h. the vertical PNP transistor operable to conduct a collector current upon an electrostatic discharge voltage less positive than the first avalanche voltage applied to the input element, the electrostatic-discharge voltage being more positive than the ordinary operating voltage of the circuitry coupled to the input element, the collector current setting a base voltage at the base of the lateral NPN transistor.

8. The integrated circuit in claim 7, further comprising a p-doped element disposed near the base of the lateral NPN transistor, the p-doped element connecting the collector of the vertical PNP transistor and distancing the lateral NPN transistor from the vertical PNP transistor to maintain a SCR-free operation.

9. The integrated circuit in claim 8, in which the NPN transistor includes a plurality emitter elements coupled an parallel, a plurality of base elements coupled in parallel, a plurality of collector elements coupled in parallel, and the p-doped element includes a plurality of p-doped sub-elements coupled in parallel.

* * * * *